United States Patent
Huang et al.

(10) Patent No.: US 9,721,931 B2
(45) Date of Patent: Aug. 1, 2017

(54) SEMICONDUCTOR LIGHT EMITTING DEVICE AND FABRICATING METHOD THEREOF

(71) Applicant: Industrial Technology Research Institute, Hsinchu (TW)

(72) Inventors: Yu-Wei Huang, Chiayi (TW); Tao-Chih Chang, Taoyuan (TW); Chih-Ming Shen, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/949,893

(22) Filed: Nov. 24, 2015

(65) Prior Publication Data

US 2016/0211415 A1 Jul. 21, 2016

Related U.S. Application Data

(60) Provisional application No. 62/103,578, filed on Jan. 15, 2015.

(30) Foreign Application Priority Data

Jun. 25, 2015 (TW) .............................. 104120507 A

(51) Int. Cl.
*H01L 25/07* (2006.01)
*H01L 25/075* (2006.01)
(Continued)

(52) U.S. Cl.
CPC .......... *H01L 25/0753* (2013.01); *H01L 24/00* (2013.01); *H01L 33/62* (2013.01); *H01L 2933/0066* (2013.01)

(58) Field of Classification Search
CPC combination set(s) only.
See application file for complete search history.

(56) References Cited

U.S. PATENT DOCUMENTS 7,960,749 B2 6/2011 Lin
2009/0267106 A1 10/2009 Lee
(Continued)

FOREIGN PATENT DOCUMENTS

WO 2014038776 3/2014

OTHER PUBLICATIONS

"Semiconductor Today, Nitride µLED displays driven at video rates, GaN-on-Si LEDs nearing sapphire-based efficiency, Compounds & Advanced Silicon," vol. 6, Issue 6, Jul./Aug. 2011, pp. 1-112.

(Continued)

*Primary Examiner* — Matthew Reames
(74) *Attorney, Agent, or Firm* — Jianq Chyun IP Office

(57) ABSTRACT

A semiconductor light emitting device including a substrate, a plurality of semiconductor light emitting units and a plurality of non-conductive walls is provided. The semiconductor light emitting device is disposed on the substrate in an array. Each of the semiconductor light emitting units has a first electrode and a second electrode opposite to the first electrode. Each of the semiconductor light emitting units is electrically connected to the substrate through the first electrode, and the semiconductor light emitting units are electrically connected together to a conducting layer through the second electrodes. The semiconductor light emitting units have different emission colors. The non-conductive walls are disposed between adjacent semiconductor light emitting units, to separate the semiconductor light emitting units. A fabricating method of semiconductor light emitting device is also provided.

15 Claims, 14 Drawing Sheets

(51) Int. Cl.
*H01L 23/00* (2006.01)
*H01L 33/62* (2010.01)

(56) References Cited

U.S. PATENT DOCUMENTS

2011/0001147 A1    1/2011   Cheng et al.
2011/0193105 A1*   8/2011   Lerman .............. H01L 25/0753
                                                                257/88

OTHER PUBLICATIONS

"Office Action of Taiwan Counterpart Application", issued on Jul. 13, 2016, p. 1-p. 5.

* cited by examiner

SEMICONDUCTOR LIGHT EMITTING DEVICE AND FABRICATING METHOD THEREOF

CROSS-REFERENCE TO RELATED APPLICATION

This application claims the priority benefits of U.S. provisional application Ser. No. 62/103,578, filed on Jan. 15, 2015 and Taiwan application serial no. 104120507, filed on Jun. 25, 2015. The entirety of each of the above-mentioned patent applications is hereby incorporated by reference herein and made a part of this specification.

TECHNICAL FIELD

The disclosure relates to a semiconductor light emitting device and a fabricating method thereof.

BACKGROUND

With the progress in photoelectric technology, many photoelectric elements are miniaturized. In recent years, a variety of micro-display technology has also been developed. Because of the breakthrough with respect to the sizes of light emitting diodes (LED), micro-LED display that is fabricated by arranging light emitting diodes in an array is drawing more and more attention. A micro-LED display is an active light emitting device display, which not only provides contrast and energy consumption comparable to an organic light emitting diode (OLED) display but has an absolute advantage in reliability and lifespan. Therefore, the micro-LED display has great potential and is very likely to become the mainstream display technology for mobile communication and Internet of Things (IoT) wearable electronic products in the future.

The micro-LED display is formed by disposing light emitting diodes in an array on a circuit board to form pixels for projecting or displaying images. During the fabrication of the micro-LED display, it may be to arrange multiple light emitting diodes on the circuit board and at the same time align the light emitting diodes with predetermined positions on the circuit board. When light emitting diodes with different colors are used to achieve color display or even full-color display, how to achieve fast packaging and accurate alignment is an important issue.

SUMMARY

A semiconductor light emitting device according to an embodiment of the disclosure includes a substrate, a plurality of semiconductor light emitting units, and a plurality of non-conductive walls. The semiconductor light emitting units are disposed on the substrate to form an array, and each of the semiconductor light emitting units has a first electrode and a second electrode opposite to each other. Each of the semiconductor light emitting units is electrically connected with the substrate through the first electrode, and the semiconductor light emitting units are electrically connected together to a conductive layer through the second electrodes. Moreover, the semiconductor light emitting units have different emission colors. The non-conductive walls are disposed between the adjacent semiconductor light emitting units to isolate the semiconductor light emitting units.

A fabricating method of a semiconductor light emitting device according to an embodiment of the disclosure includes disposing a plurality of non-conductive walls on a substrate. An alignment position is formed between every two adjacent non-conductive walls. A plurality of semiconductor light emitting units on a first carrier board are respectively aligned to the alignment positions. The semiconductor light emitting units are divided into a plurality of groups. The semiconductor light emitting units in one of the groups are dissociated from the first carrier board. Thus, the semiconductor light emitting units in the group fall into the corresponding alignment positions due to gravity. Each of the semiconductor light emitting units is electrically connected with the substrate through a first electrode. A conductive layer is formed on the semiconductor light emitting units. Accordingly, the semiconductor light emitting units are electrically connected together to the conductive layer through second electrodes.

A fabricating method of a semiconductor light emitting device according to an embodiment of the disclosure includes disposing a magnetic device on a side of a substrate. A plurality of non-conductive walls are disposed on another side of the substrate opposite to the magnetic device. An alignment position is formed between every two adjacent non-conductive walls. A plurality of semiconductor light emitting units on a first carrier board are respectively aligned to the alignment positions. The semiconductor light emitting units are divided into a plurality of groups. The semiconductor light emitting units in one of the groups are dissociated from the first carrier board. Thus the semiconductor light emitting units of the group and the magnetic device magnetically attract each other, making the semiconductor light emitting units fall into the corresponding alignment positions. Each of the semiconductor light emitting units is electrically connected with the substrate through a first electrode. A conductive layer is formed on the semiconductor light emitting units. Accordingly, the semiconductor light emitting units are electrically connected together to the conductive layer through second electrodes.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1A:
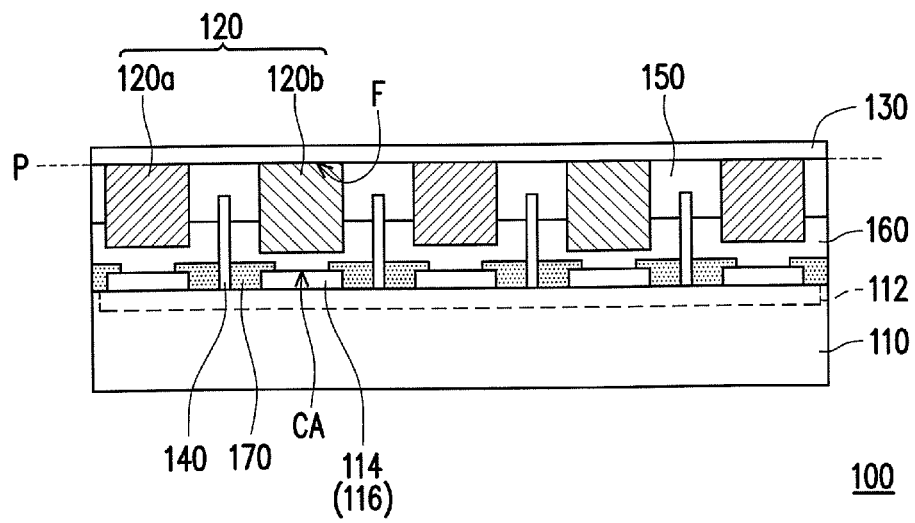
FIG. 1A is a schematic cross-sectional view of the semiconductor light emitting device according to an embodiment of the disclosure.
Figure 1B:
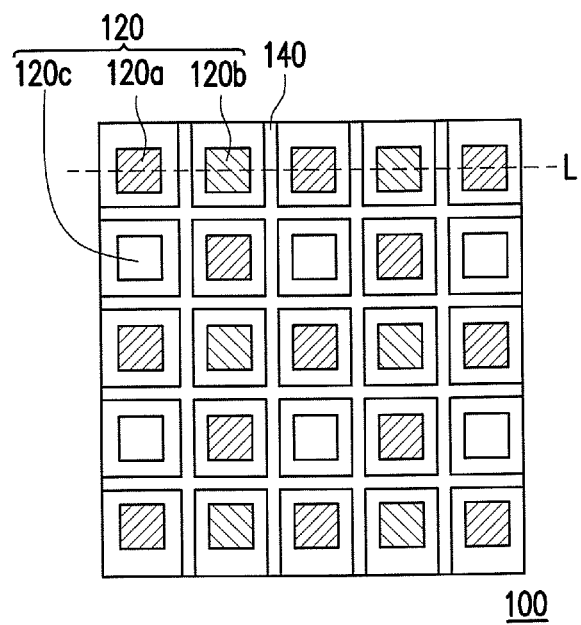
FIG. 1B is a schematic top view of the semiconductor light emitting device in the embodiment of FIG. 1A.
Figure 1C:
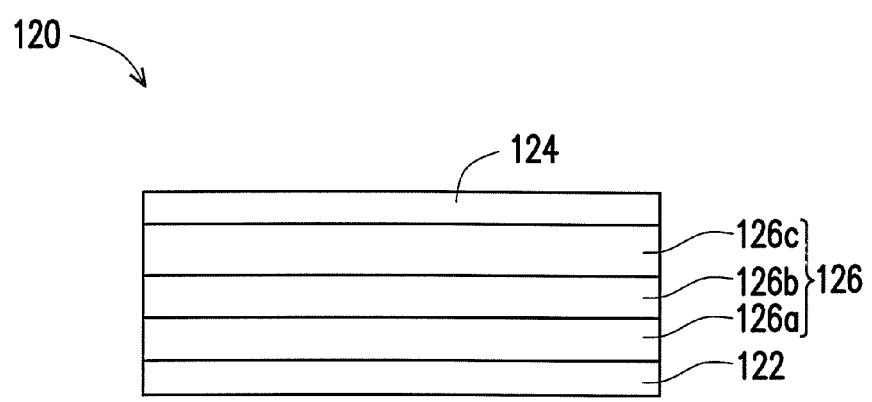
FIG. 1C is a schematic cross-sectional view of the semiconductor light emitting unit in the embodiment of FIG. 1A.

FIG. 1A is a schematic cross-sectional view of a semiconductor light emitting device according to an embodiment of the disclosure. FIG. 1B is a schematic top view of the semiconductor light emitting device in the embodiment of FIG. 1A. FIG. 1C is a schematic cross-sectional view of a semiconductor light emitting unit in the embodiment of FIG. 1A. With reference to FIG. 1A, in this embodiment, a semiconductor light emitting device 100 includes a substrate 110, a plurality of semiconductor light emitting units 120, and a plurality of non-conductive walls 140. The semiconductor light emitting units 120 have different emission colors. The semiconductor light emitting units 120 include a red semiconductor light emitting unit, a green semiconductor light emitting unit, and a blue semiconductor light emitting unit. In addition, the semiconductor light emitting units 120 may further include a yellow semiconductor light emitting unit or semiconductor light emitting units of other different colors. In some embodiments, one single semiconductor light emitting unit 120 may emit light of different colors. Nevertheless, the disclosure is not limited thereto.

Next, referring to FIG. 1A and FIG. 1B, FIG. 1A is a schematic cross-sectional view of the semiconductor light emitting device 100 of FIG. 1B taken along the dotted line L. In this embodiment, the semiconductor light emitting units 120 are divided into semiconductor light emitting units 120*a*, 120*b*, and 120*c* that have different emission colors. The semiconductor light emitting units 120 (120*a*, 120*b*, and 120*c*) are disposed on the substrate 110 to form an array. In this embodiment, a surface F of each of the semiconductor light emitting units 120 on the side facing away from the substrate 110 is arranged on the same horizontal plane P. The semiconductor light emitting units 120 (120*a*, 120*b*, and 120*c*) are light emitting diodes (LED), for example. The light emitting diodes 120 that have different colors may form pixels of a micro-LED display for displaying a colored image, for example. Otherwise, the light emitting diodes 120 having different colors may project a colored image through projection. In some embodiments, the light emitting diodes 120 having different colors may be arranged properly or the colors thereof may be selected, so as to achieve a full-color display or projection effect. Nevertheless, in some other embodiments, the light emitting diodes may have the same color to achieve a single color effect. The disclosure here is not intended to limit the choice of colors and arrangement of the semiconductor light emitting units. The choice of colors of the semiconductor light emitting units 120 and the arrangement of the semiconductor light emitting units 120 on the substrate 110 may be varied according to different requirements of use, design specifications, and product positioning.

Then, referring to FIG. 1C, in this embodiment, each of the semiconductor light emitting units 120 has a first electrode 122 and a second electrode 124 opposite to each other. Moreover, the semiconductor light emitting unit 120 further includes a semiconductor stack layer 126 disposed between the first electrode 122 and the second electrode 124. The semiconductor stack layer 126 includes a first type semiconductor layer 126*a*, a light emitting layer 126*b*, and a second type semiconductor layer 126*c*. The light emitting layer 126*b* is disposed between the first type semiconductor layer 126*a* and the second type semiconductor layer 126*c*. The first type semiconductor layer 126*a* is disposed between the first electrode 122 and the light emitting layer 126*b*. The second type semiconductor layer 126*c* is disposed between the second electrode 124 and the light emitting layer 126*b*. In this embodiment, the semiconductor light emitting unit 120 is a light emitting diode. The first type semiconductor layer 126*a* is an N-type semiconductor layer and the second type semiconductor layer 126*c* is a P-type semiconductor layer. The first electrode 122 is an N electrode corresponding to the N-type semiconductor layer and the second electrode 124 is a P electrode corresponding to the P-type semiconductor layer. However, in some embodiments, the first type semiconductor layer 126*a* may be a P-type semiconductor layer and the second type semiconductor layer 126*c* may be an N-type semiconductor layer. Accordingly, the first electrode 122 is a P electrode corresponding to the P-type semiconductor layer and the second electrode 124 is an N electrode corresponding to the N-type semiconductor layer. Nevertheless, the disclosure is not limited thereto. The light emitting layer 126*b* includes a multiple quantum well (MQW) structure. In some embodiments, the light emitting layer 126*b* may also include a quantum well (QW) structure or other structures. Besides, in some embodiments, the semiconductor light emitting unit 120 further includes a protective layer (not shown). The protective layer covers the periphery of the semiconductor stack layer 126, the first electrode 122, and the second electrode 124 in a manner that the first electrode 122 and the second electrode 124 of the semiconductor light emitting unit 120 are exposed. The semiconductor light emitting unit 120 is electrically connected to corresponding external electrodes through the exposed first electrode 122 and the exposed second electrode 124. The light emitting layer 126*b* emits light by a current applied from the corresponding external electrodes.

Referring to FIGS. 1A and 1C together, in this embodiment, the structure of the semiconductor light emitting unit 120 in the embodiment of FIG. 1C also applies to the semiconductor light emitting units 120*a* and 120*b* having different emission colors in FIG. 1A. The substrate 110 includes a circuit structure 112 and a plurality of connecting conductors 114. Each connecting conductor 114 is disposed between one semiconductor light emitting unit 120 (120*a* or 120*b*) and the circuit structure 112. In addition, the first electrode 112 of each semiconductor light emitting unit 120 is electrically connected with the circuit structure 112 of the substrate 110 through one connecting conductor 114, and the semiconductor light emitting units 120 are electrically connected together to a conductive layer 130 through the second electrodes 124. Thus, the semiconductor light emitting units 120 arranged in the array are driven by a current transmitted by the circuit structure 112 and turned on. The semiconductor light emitting units 120 emit light when being turned on, so as to achieve various effects required, such as displaying or projecting an image. In this embodiment, the substrate 110 with the circuit structure 112 of different designs may be a semiconductor substrate, a submount, a complementary metal-oxide-semiconductor (CMOS) substrate, or a liquid crystal on silicon (LCOS) substrate. A material of the connecting conductors 114 includes a metal. In some embodiments, the material of the connecting conductors 114 may also include other conductive materials. The disclosure is not intended to limit the form of the substrate 110, the circuit structure 112 corresponding to the substrate 110, and the material of the connecting conductors 114, which may be varied according to different requirements of use, design specifications, and product positioning. Moreover, the substrate 110 further includes a plurality of electrode pads 116 (not shown). Each electrode pad 116 is disposed between one connecting conductor 114 and the circuit structure 112. In this embodiment, the connecting conductors 114 of the substrate 110 electrically connect the first electrodes 122 and the circuit structure 112 through the electrode pads 116.

With reference to FIG. 1A, in this embodiment, the conductive layer 130 is disposed on the surfaces F of the semiconductor light emitting units 120 on the side facing away from the substrate 110. Moreover, the semiconductor light emitting device 100 further includes a non-conductive layer 150 disposed between the substrate 110 and the conductive layer 130 and between two adjacent semiconductor light emitting units 120 (between the adjacent semiconductor light emitting units 120a and 120b, for example). The non-conductive layer 150 electrically isolates the circuit structure 112 of the substrate 110 and the conductive layer 130. Therefore, the current transmitted by the circuit structure 112 and the conductive layer 130 does not pass through the non-conductive layer 150, thereby preventing a short circuit in the semiconductor light emitting device 100.

In this embodiment, the non-conductive walls 140 of the semiconductor light emitting device 100 are disposed between the adjacent semiconductor light emitting units 120 (between every two adjacent semiconductor light emitting units 120, for example; the non-conductive wall 140 may be disposed between the adjacent semiconductor light emitting units 120a and 120b, for example) for isolating the semiconductor light emitting units 120. The non-conductive walls 140 may be disposed in advance before the semiconductor light emitting units 120 are disposed on the substrate 110. Each semiconductor light emitting unit 120 may be aligned with a space between the adjacent non-conductive walls (between the every two adjacent non-conductive walls 140, for example) and guided by the non-conductive walls 140 to be disposed in the corresponding position. In other words, the semiconductor light emitting unit 120 may be guided by the non-conductive walls 140 to be quickly disposed on the substrate 110 and more accurately aligned to the correct position. With the non-conductive walls 140, the semiconductor light emitting device 100 may be fabricated through quick packaging and accurate alignment.

Continuing to refer to FIG. 1, in this embodiment, the semiconductor light emitting device 100 further includes a bonding layer 160 disposed between the semiconductor light emitting unit 120 and the corresponding connecting conductor 114. A material of the bonding layer 160 includes a conductive material such as solder. The semiconductor light emitting units 120 are bonded to or attached to the corresponding position on the substrate 110 through the bonding layer 160. In addition, the semiconductor light emitting units 120 may maintain electrical connection with the substrate 110 through the bonding layer 160. Nevertheless, in some embodiments, the material of the bonding layer 160 may also include a non-conductive material. The semiconductor light emitting units may maintain electrical connection with the substrate through other elements.

In this embodiment, the semiconductor light emitting device 100 further includes an insulating protective layer 170 disposed between the substrate 110 and the bonding layer 160. Moreover, each connecting conductor 114 has a connection area CA. Each first electrode 122 is electrically connected with the substrate 110 through the connection area CA of one connecting conductor 114. The insulating protective layer 170 covers the substrate 110 and areas other than the connection areas CA of the connecting conductors 114. The insulating protective layer 170 may be a passivation layer in a semiconductor fabricating process. In this embodiment, the insulating protective layer 170 protects the circuit structure 110 and partial areas of the connecting conductors 114. Therefore, in the fabricating process of the semiconductor light emitting device 100, the circuit structure 112 and the aforementioned areas are not easily damaged or contaminated by other fabricating processes.

Figure 2A:
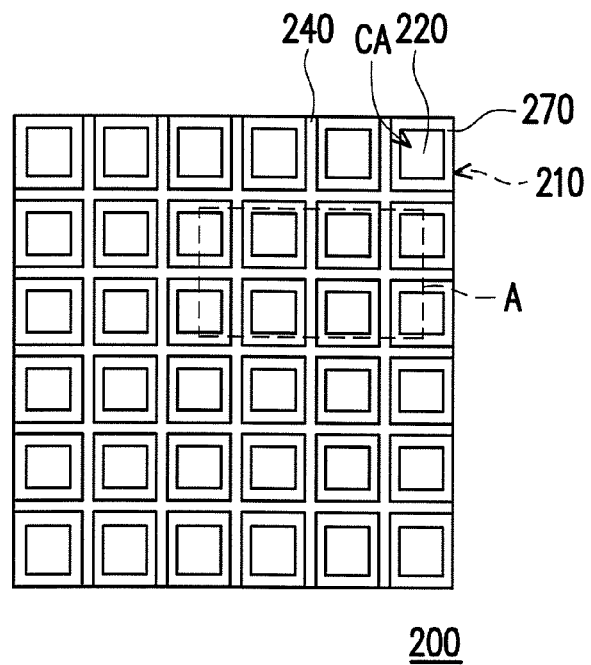
FIG. 2A is a schematic top view of the semiconductor light emitting device according to another embodiment of the disclosure.
Figure 2B:
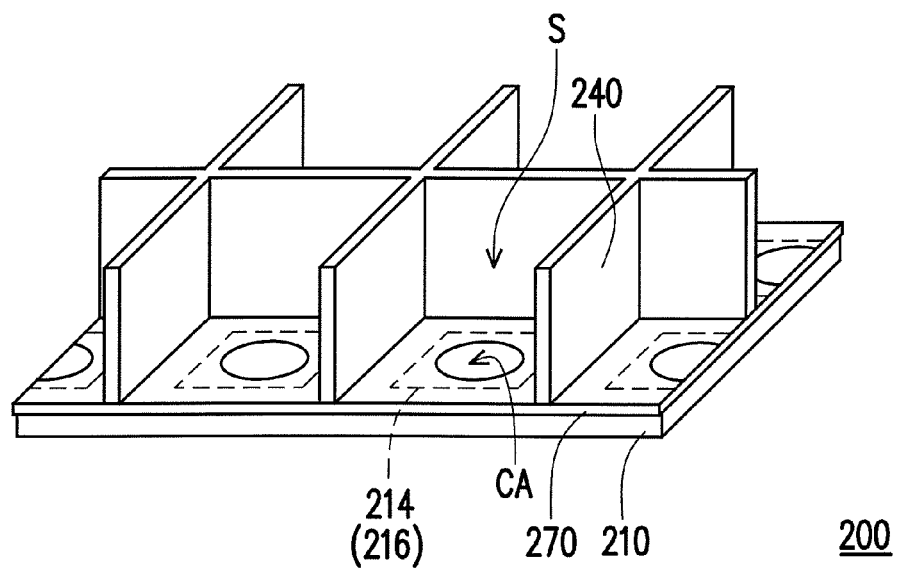
FIG. 2B is a schematic isometric view of the area A of the semiconductor light emitting device in the embodiment of FIG. 2A.

FIG. 2A is a schematic top view of the semiconductor light emitting device according to another embodiment of the disclosure. FIG. 2B is a schematic isometric view of an area A of the semiconductor light emitting device in the embodiment of FIG. 2A. Referring to FIG. 2A and FIG. 2B, a semiconductor light emitting device 200 is similar to the semiconductor light emitting device 100 of FIG. 1A. Components and functions thereof have been specified in the embodiment related to the semiconductor light emitting device 100 of FIG. 1A and thus are not repeated hereinafter. In this embodiment, in order to clearly present the shape and configuration of non-conductive walls 240, FIG. 2A illustrates the configuration of semiconductor light emitting units 220 and the non-conductive walls 240 on a substrate 210 in a simplified manner. In FIG. 2A, at least the conductive layer, the non-conductive layer, and the bonding layer are omitted from the semiconductor light emitting device 100. Moreover, in order to clearly present the connection area CA of a connecting conductor 214, the semiconductor light emitting units 220 are omitted from FIG. 2B. In this embodiment, the non-conductive walls 240 are arranged and disposed on the substrate 210 in a grid pattern. The non-conductive walls 240 and the substrate 210 form a plurality of accommodating spaces S, and each semiconductor light emitting unit 220 is disposed in one accommodating space S. The grid pattern may have various shapes, e.g., a rectangular grid pattern, a triangular grid pattern, or a polygonal grid pattern, but the disclosure is not limited to the foregoing. In this embodiment, the substrate 210 and the circuit structure thereof are covered by an insulating protective layer 270, and the areas other than the connection area CA of the connecting conductor 214 is also covered by the insulating protective layer 270. Each semiconductor light emitting unit 220 is disposed in the corresponding accommodating space S and electrically connected with the circuit structure of the substrate 210 through the connection area CA of the connecting conductor 214.

Figure 3:
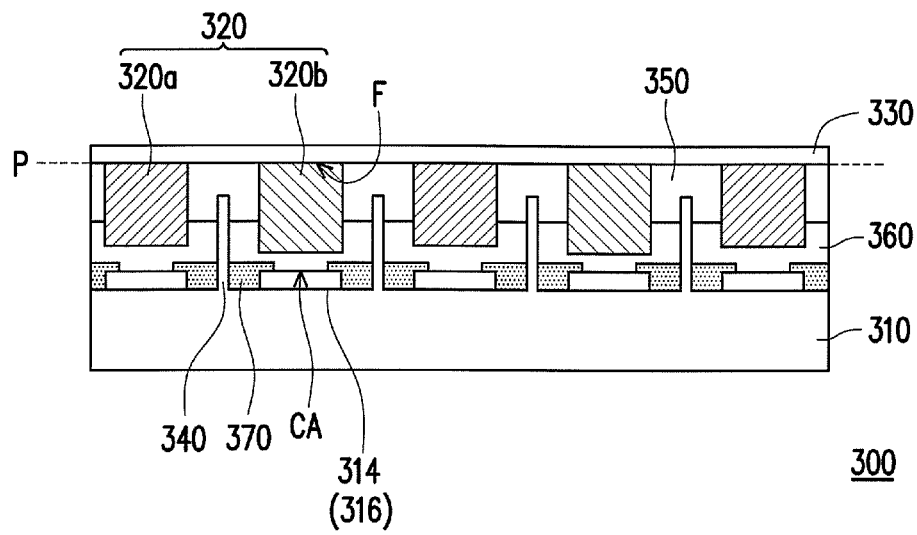
FIG. 3 is a schematic cross-sectional view of the semiconductor light emitting device according to yet another embodiment of the disclosure.

FIG. 3 is a schematic cross-sectional view of the semiconductor light emitting device according to yet another embodiment of the disclosure. Referring to FIG. 3, in this embodiment, a semiconductor light emitting device 300 is similar to the semiconductor light emitting device 100 of FIG. 1A. Components and functions thereof have been specified in the embodiment related to the semiconductor light emitting device 100 of FIG. 1A and thus are not repeated hereinafter. A difference between the semiconductor light emitting device 300 and the semiconductor light emitting device 100 is that non-conductive walls 340 and a substrate 310 of the semiconductor light emitting device 300 are formed integrally. That is, the non-conductive walls 340 and the substrate 310 are connected with each other and include the same material. A fabricating method for forming the non-conductive walls 340 and the substrate 310 includes forming the non-conductive walls 340 in a grid pattern on a substrate material by etching, for example.

Figure 4:
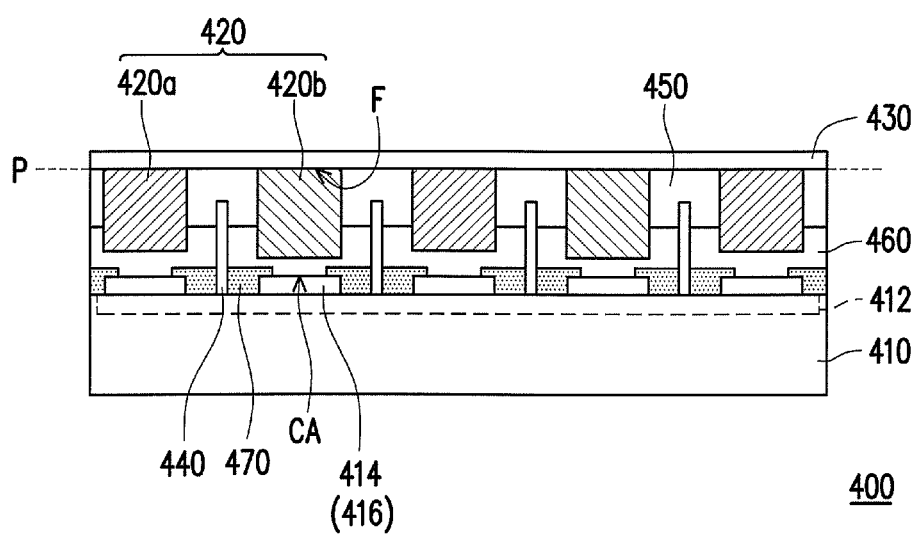
FIG. 4 is a schematic cross-sectional view of the semiconductor light emitting device according to yet another embodiment of the disclosure.

FIG. 4 is a schematic cross-sectional view of the semiconductor light emitting device according to yet another embodiment of the disclosure. Referring to FIG. 4, in this embodiment, a semiconductor light emitting device 400 is similar to the semiconductor light emitting device 100 of FIG. 1A. Components and functions thereof have been specified in the embodiment related to the semiconductor light emitting device 100 of FIG. 1A and thus are not repeated hereinafter. A difference between the semiconductor light emitting device 400 and the semiconductor light emitting device 100 is that semiconductor light emitting units 420 (420a and 420b) of the semiconductor light emitting device 400 are connected to a substrate 410 by adhering. A material of a bonding layer 460 of the semiconductor light emitting device 400 may be an anisotropic conductive adhesive (ACA), an anisotropic conductive film (ACF), or other materials having both conductive and adhesive properties. The semiconductor light emitting units 420 may be adhered to the substrate 410 through the bonding layer 460 and at the same time electrically connected with the substrate 410 through the bonding layer 460. Nevertheless, in some embodiments, the bonding layer 460 may not have a conductive property. The semiconductor light emitting units 420 may also be electrically connected with the substrate 410 through other elements.

Figure 5:
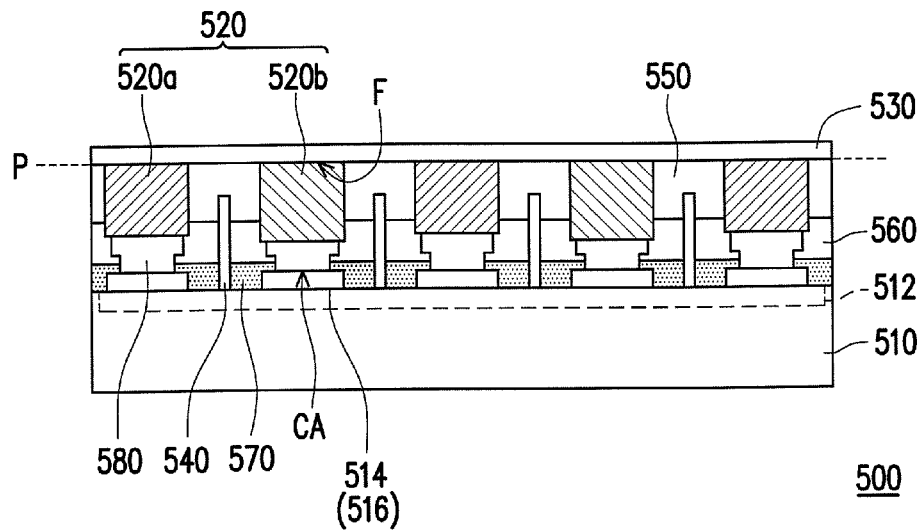
FIG. 5 is a schematic cross-sectional view of the semiconductor light emitting device according to another embodiment of the disclosure.

FIG. 5 is a schematic cross-sectional view of the semiconductor light emitting device according to another embodiment of the disclosure. Referring to FIG. 5, in this embodiment, a semiconductor light emitting device 500 is similar to the semiconductor light emitting device 400 of FIG. 4. Components and functions thereof have been specified in the embodiment related to the semiconductor light emitting device 400 of FIG. 4 and thus are not repeated hereinafter. A difference between the semiconductor light emitting device 500 and the semiconductor light emitting device 400 is that the semiconductor light emitting device 500 further includes a plurality of conductive bumps 580. Each conductive bump 580 is disposed between a first electrode (not shown) and a connecting conductor 514. Meanwhile, the first electrode (not shown) of each semiconductor light emitting unit 520 (520a and 520b) is electrically connected with the corresponding connecting conductor 514 through one conductive bump 580. Moreover, in this embodiment, a material of the bonding layer 560 includes a bonding adhesive material. The bonding adhesive material may be a non-conductive material. Therefore, each semiconductor light emitting unit 520 is not electrically connected with the corresponding connecting conductor 514 through the bonding layer 560. The material of the bonding layer 560 may be a non-conductive adhesive (NCA), an adhesive layer formed of an ultraviolet adhesive agent, an adhesive layer formed of an epoxy adhesive (AB glue), or other materials that have adhesive properties. In addition, the material of the bonding layer 560 may be an anisotropic conductive adhesive (ACA), an anisotropic conductive film (ACF), or other materials having both conductive and adhesive properties. Nevertheless, the disclosure is not limited thereto. The semiconductor light emitting units 520 may be adhered to the substrate 510 through the bonding layer 560 and at the same time electrically connected with the substrate 410 through the conductive bumps 580. Furthermore, in some embodiments, the bonding layer 560 may have a conductive property. Each semiconductor light emitting unit 520 may be electrically connected with the substrate 510 through both one conductive bump 580 and the bonding layer 560 having a conductive property.

Figure 6:
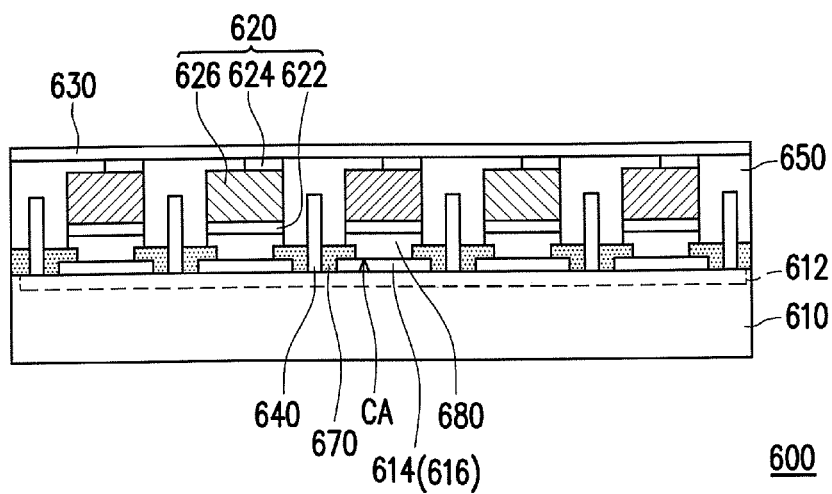
FIG. 6 is a schematic cross-sectional view of the semiconductor light emitting device according to yet another embodiment of the disclosure.

FIG. 6 is a schematic cross-sectional view of a semiconductor light emitting device according to yet another embodiment of the disclosure. Referring to FIG. 6, in this embodiment, a semiconductor light emitting device 600 is similar to the semiconductor light emitting device 500 of FIG. 5. Components and functions thereof have been specified in the embodiment related to the semiconductor light emitting device 500 of FIG. 5 and thus are not repeated hereinafter. A difference between the semiconductor light emitting device 600 and the semiconductor light emitting device 500 is that a first electrode 622 of each semiconductor light emitting unit 620 of the semiconductor light emitting device 600 is bonded to a substrate 610 through eutectic bonding and electrically connected with the substrate 610. Each conductive bump 680 is disposed between the first electrode 620 of one semiconductor light emitting unit 620 and the corresponding connecting conductor 614. The materials of the first electrode 622 and the conductive bump 680 may both be metals. Through heating, a eutectic reaction is generated between the first electrode 622 and the conductive bump 680 to achieve bonding. The eutectic reaction includes liquid phase eutectic bonding or eutectic solidification bonding. The material of the first electrode 622 may be gold (Au) and the material of the conductive bump 680 may be tin (Sn), for example. Through heating, a eutectic reaction is generated between the first electrode 622 and the conductive bump 680 to form an intermetallic compound (IMC) for bonding. In some embodiments, the first electrode 622 and the conductive bump 680 may include other materials suitable for eutectic bonding. Nevertheless, the disclosure is not limited thereto. Moreover, in some embodiments, the semiconductor light emitting device may not include the conductive bump. The first electrode is directly bonded to the connecting conductor through eutectic bonding, so as to bond and electrically connect the semiconductor light emitting units to the substrate. In addition, each semiconductor light emitting unit 620 of the semiconductor light emitting device 600 is electrically connected together to the conductive layer 630 through the second electrode 624.

Figure 7:
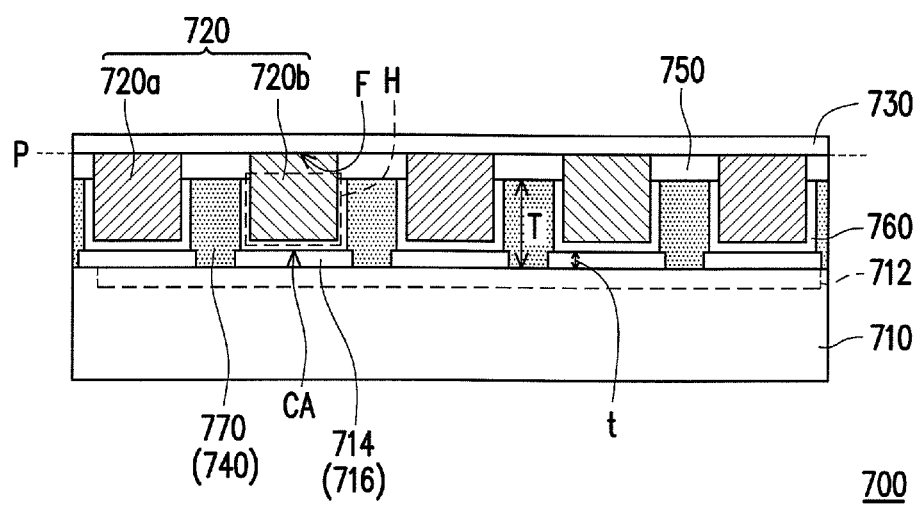
FIG. 7 is a schematic cross-sectional view of the semiconductor light emitting device according to yet another embodiment of the disclosure.

FIG. 7 is a schematic cross-sectional view of a semiconductor light emitting device according to yet another embodiment of the disclosure. Referring to FIG. 7, in this embodiment, a semiconductor light emitting device 700 is similar to the semiconductor light emitting device 100 of FIG. 1A. Components and functions thereof have been specified in the embodiment related to the semiconductor light emitting device 100 of FIG. 1A and thus are not repeated hereinafter. A difference between the semiconductor light emitting device 700 and the semiconductor light emitting device 100 is that a thickness T of an insulating protective layer 770 of the semiconductor light emitting device 700 is greater than a thickness t of a connecting conductor 714. The insulating protective layer 770 and the connecting conductors 714 form a plurality of recesses H, each of the recesses H corresponds to the position of a semiconductor light emitting unit 720 (720a and 720b). The insulating protective layer 770 between every two adjacent semiconductor light emitting units 720 forms a non-conductive wall 740. The non-conductive walls 740 of the semiconductor light emitting device 700 are formed by forming the recesses H on the insulating protective layer 770.

Since the semiconductor light emitting devices of FIG. 2A, FIG. 2B, FIG. 3, FIG. 4, FIG. 5, FIG. 6, and FIG. 7 all have the non-conductive walls, the semiconductor light emitting units of the above embodiments may be guided by the non-conductive walls to be quickly disposed on the substrate and more accurately aligned to the correct positions. With the non-conductive walls, the semiconductor light emitting device of the embodiments may be fabricated through quick packaging and accurate alignment.

Figure 8A:
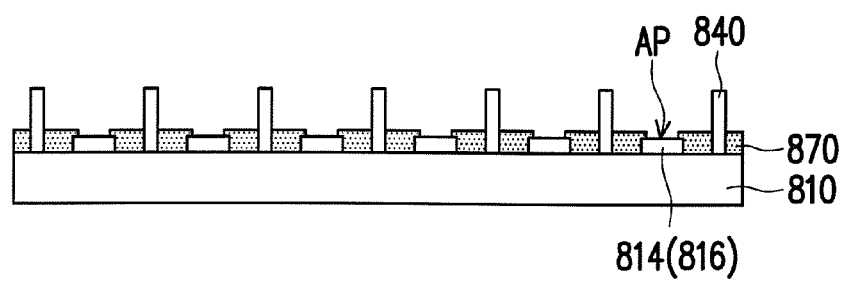
FIG. 8A to FIG. 8H are schematic views showing a fabricating method of the semiconductor light emitting device according to another embodiment of the disclosure.
Figure 8B:
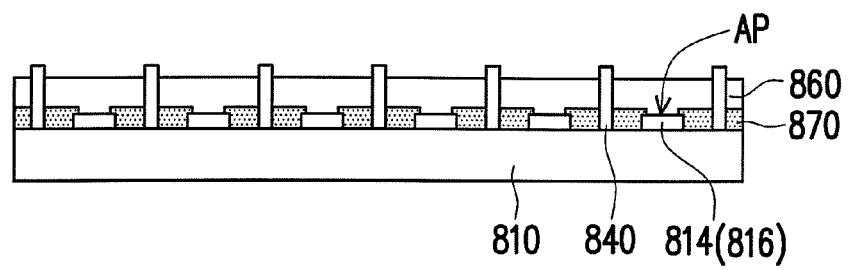

FIG. 8A to FIG. 8H are schematic views showing a fabricating method of the semiconductor light emitting device according to another embodiment of the disclosure. Referring to FIG. 8A and FIG. 8B first, in this embodiment, the fabricating method of the semiconductor light emitting device is at least applicable to the semiconductor light emitting device 100 of the embodiment of FIG. 1A. Corresponding descriptions of the components and electrical connection may be referred to the embodiment of FIG. 1A related to the semiconductor light emitting device 100. In addition, the fabricating method of the semiconductor light emitting device of this embodiment may be adjusted as appropriate to be applicable to at least the semiconductor light emitting devices 200 to 700 of the embodiments of FIG. 2A to FIG. 7. The fabricating method of the semiconductor light emitting device of this embodiment includes disposing a plurality of non-conductive walls 840 on a substrate 810. An alignment position AP is formed between every two adjacent non-conductive walls 840. In some embodiment, the non-conductive walls are arranged and disposed on the substrate in a grid pattern. The non-conductive walls and the substrate form a plurality of accommodating spaces, and each alignment position AP is located in one accommodating space. Descriptions concerning the corresponding components and electrical connection may be referred to the embodiment of FIG. 2A related to the semiconductor light emitting device 200, and thus are not repeated hereinafter. In some other embodiments, the fabricating method of the semiconductor light emitting device further includes integrally forming the substrate and the non-conductive walls. Descriptions concerning the corresponding components and electrical connection may be referred to the semiconductor light emitting device 300 in the embodiment of FIG. 3, and thus are not repeated hereinafter.

The fabricating method of the semiconductor light emitting device further includes foil ling a circuit structure (not shown) and a plurality of connecting conductors 814 on the substrate 810. Moreover, a plurality of electrode pads 816 are formed on the substrate 810. Each of the electrode pads 816 is correspondingly disposed between one connecting conductor 814 and the circuit structure (not shown). Then, an insulating protective layer 870 covers the substrate 810, and covers areas other than the connection areas CA of the connecting conductors 814. Then, a bonding layer 860 is formed between two adjacent non-conductive walls 840. In this embodiment, the insulating protective layer 870 is located between the substrate 810 and the bonding layer 860.

Besides, some embodiments of the fabricating method of the semiconductor light emitting device further include forming a plurality of conductive bumps, and each conductive bump is located on one connecting conductor 814. Descriptions concerning the corresponding components and electrical connection may be referred to the embodiment of FIG. 5 related to the semiconductor light emitting device 500 and the embodiment of FIG. 6 related to the semiconductor light emitting device 600, and thus are not repeated hereinafter.

Besides, in some embodiments of the fabricating method of the semiconductor light emitting device, the bonding layer may be formed of a material having both conductive and adhesive properties. Descriptions concerning the corresponding components and electrical connection may be referred to the embodiment of FIG. 4 the semiconductor light emitting device 400, and thus are not repeated hereinafter.

Figure 8C:
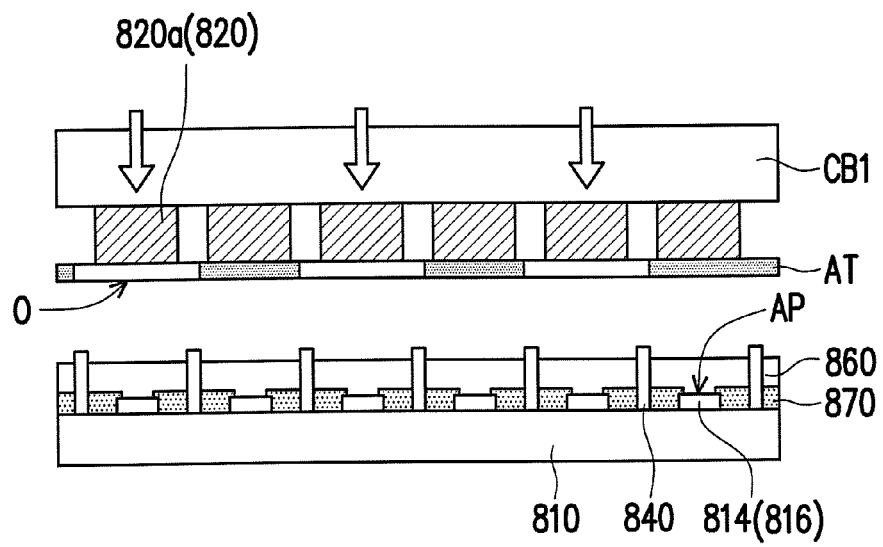

Then, referring to FIG. 8C, a plurality of semiconductor light emitting units 820a (820) on a first carrier board CB1 are respectively aligned to the alignment positions AP. In this embodiment, the semiconductor light emitting units 820a on the first carrier board CB1 are respectively aligned to the alignment positions AP by using an alignment tool AT. The semiconductor light emitting units 820a are divided into a plurality of groups. For example, the semiconductor light emitting units 820a indicated with arrows in FIG. 8C are set as a group, and other semiconductor light emitting units 820a are set as another group. In other embodiments of the disclosure, the groups may be set according to different needs. Besides, the semiconductor light emitting units 820a (820) may be red light emitting diodes, green light emitting diodes, blue light emitting diodes, or light emitting diodes of other colors. The disclosure is not limited thereto.

Figure 8D:
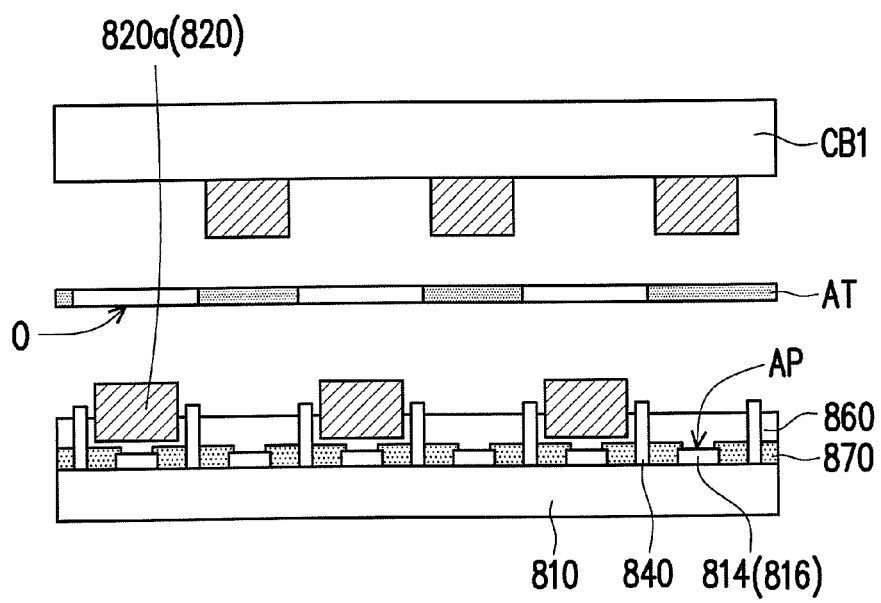

Referring to FIG. 8D, the semiconductor light emitting units 820a (820) of one of the groups are disassociated from the first carrier board CB1. Therefore, the semiconductor light emitting units 820a (i.e., the semiconductor light emitting units 820a indicated by the arrows in FIG. 8C) included by the group on the first carrier board CB1 fall into the corresponding alignment positions AP due to gravity. The semiconductor light emitting units 820 fall into the corresponding alignment positions AP through guidance of the alignment tool AT. For example, the alignment tool AT includes a mesh plate, a steel plate, a plate having a plurality of alignment holes, or the like which may be employed. The alignment tool AT includes a plurality of openings O corresponding to positions of the semiconductor light emitting units 820a of the group on the first carrier board CB1. By performing a laser lift-off process, for example, the semiconductor light emitting units 820a of the group on the first carrier board CB1 are dissociated from the first carrier board CB1. Then, by using the alignment tool AT, the dissociated semiconductor light emitting units 820 are guided to fall into the corresponding alignment positions AP.

Figure 8E:
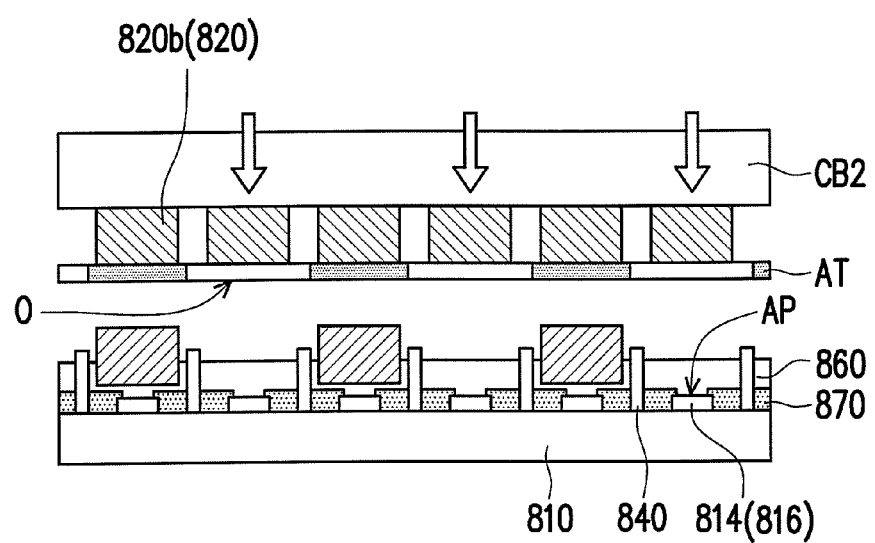

Then, referring to FIG. 8E, a plurality of semiconductor light emitting units 820b (820) on a second carrier board CB2 are respectively aligned to the alignment positions AP by using the alignment tool AT. The semiconductor light emitting diodes 820b on the second carrier board CB2 are divided into a plurality of groups. For example, the semiconductor light emitting units 820b indicated with arrows in FIG. 8E are set as a group, while other semiconductor light emitting units 820b are set as another group. In other embodiments of the disclosure, the groups may be set according to different needs. In this embodiment, the semiconductor light emitting units 820b on the second carrier board CB2 and the semiconductor light emitting units 820a on the first carrier board CB1 have different emission colors. Besides, the alignment positions AP that the semiconductor light emitting units 820b on the second carrier board CB2 correspond to are different from the alignment positions AP that the semiconductor light emitting units 820a on the first carrier board CB1 correspond to.

Figure 8F:
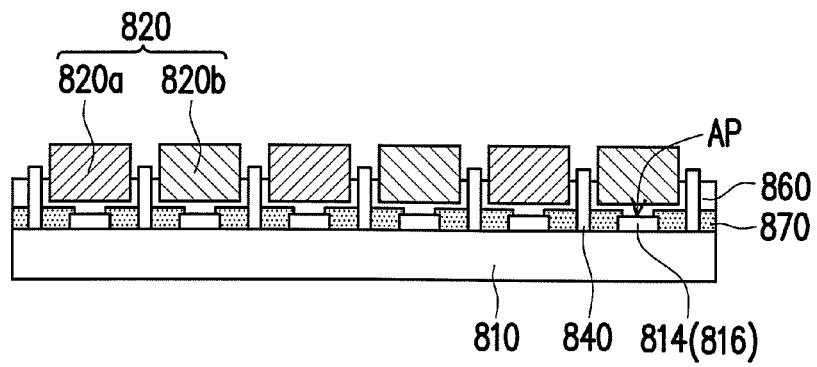

Then, referring to FIGS. 8E and 8F together, the semiconductor light emitting units 820b (820) of one of the groups on the second carrier board CB2 are dissociated from the second carrier board CB2. Thus, the semiconductor light emitting units 820b (i.e., the semiconductor light emitting units 820b indicated with the arrows in FIG. 8E) of the group on the second carrier board CB2 fall into the corresponding alignment positions AP due to gravity.

After the semiconductor light emitting units 820a of the group on the first carrier board CB1 are dissociated from the first carrier board CB1 and fall into the corresponding alignment positions AP, the first carrier board CB1 is removed. Then, the semiconductor light emitting units 820b (820) on the second carrier board CB2 are aligned to the alignment positions AP. Besides, a position of the alignment tool AT is adjusted by, for example, horizontally moving the alignment tool AP a distance, making the openings O of the alignment tool AT correspond to the positions of the semiconductor light emitting units 820b in the group on the second carrier board CB2. Then, in the same way of the semiconductor light emitting units 820a, the semiconductor light emitting units 820b of the group on the second carrier board CB2 are dissociated from the second carrier board CB2 and fall into the corresponding alignment positions AP.

Besides, some embodiments may further include a third carrier board (not shown). By adopting the same way that makes the semiconductor light emitting units 820b of the chosen group on the second carrier board CB2 fall into the corresponding alignment positions AP in this embodiment, the semiconductor light emitting units 820 in the chosen group on the third carrier board (not shown) also fall into the corresponding alignment positions AP. In this embodiment, the semiconductor light emitting units 820 on the carrier boards fall into the corresponding alignment positions AP according to the above process. Thus, the semiconductor light emitting units having different emission colors (e.g., the semiconductor light emitting units 820a and 820b having different emission colors) are disposed on the substrate 810. In some embodiments, the semiconductor light emitting units 820 having different colors may be light emitting diodes having different colors. The light emitting diodes of different colors may be arranged properly or the colors thereof may be selected to achieve a full-color display or projection effect.

In this embodiment, the alignment tool AT has the openings O corresponding to the positions of the semiconductor light emitting units 820. Thus, in the fabricating method of the semiconductor light emitting device, the dissociated semiconductor light emitting units 820 may be prevented from being dissociated and falling into incorrect alignment positions AP, or the semiconductor light emitting units 820 that should not be dissociated may be prevented from being dissociated and falling. In this way, the accuracy and speed of aligning and disposing the semiconductor light emitting units 820 on the substrate 810 are increased.

Figure 8G:
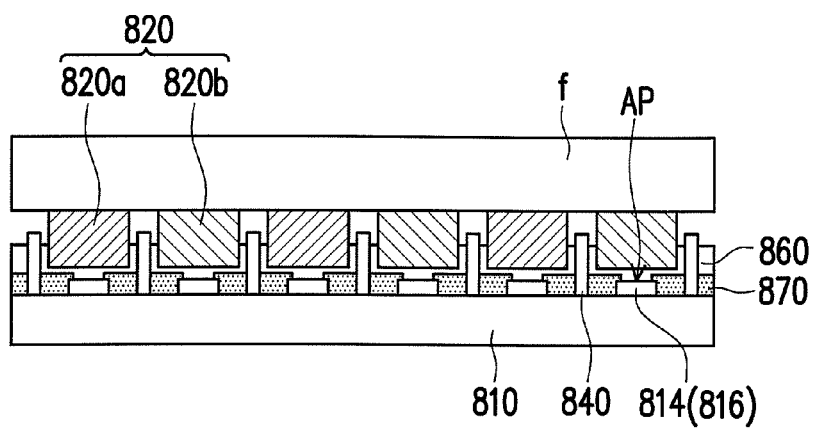
Figure 8H:
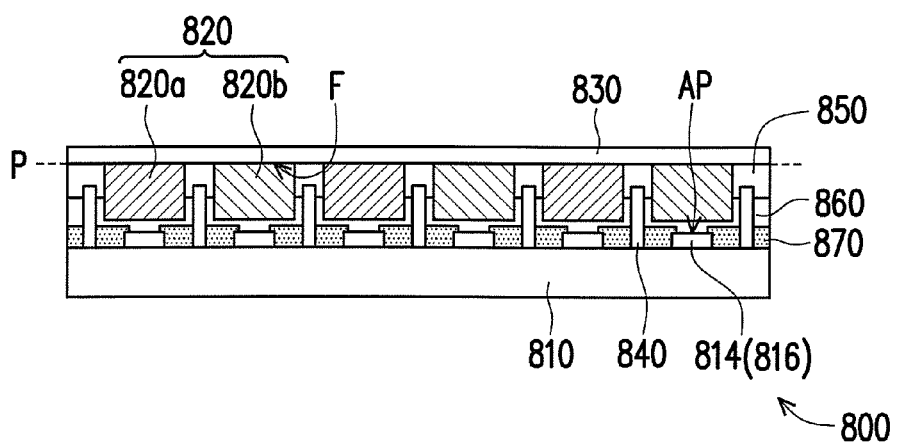

Referring to FIGS. 8G and 8H, then, each semiconductor light emitting unit 820 (820a and 820b) is electrically connected with the substrate 810. In this embodiment, each connecting conductor 814 is disposed between one semiconductor light emitting unit 820 and the circuit structure (not shown) of the substrate 810. The fabricating method of the semiconductor light emitting device of this embodiment further includes forming the electrode pads 816 on the substrate 810. Thus, through the electrode pads 816, the connecting conductors 814 makes the first electrodes (not shown) of the semiconductor light emitting units 820 electrically connected with the circuit structure (not shown) of the substrate 810. The semiconductor light emitting units 820 are electrically connected with the substrate 810 by applying a pressure to the side of the semiconductor light emitting units 820 facing away from the substrate 810. For example, by applying a pressure to the side of the semiconductor light emitting units 820 facing away from the substrate 810 by using a pressing member f, the surfaces F of the semiconductor light emitting units 820 on the side facing away from the substrate 810 are located on the same horizontal plane P. Meanwhile, in other embodiments of the disclosure, the semiconductor light emitting devices 800 may also be heated when exerting the pressure, so as to reinforce the bonding property and make the semiconductor light emitting units 820 electrically connected with the substrate 810.

In some embodiments, the process of electrically connecting the semiconductor light emitting units 820 to the substrate 810 through the first electrodes (not shown) further includes heating the semiconductor light emitting device 800 to bond the first electrodes (not shown) of the semiconductor light emitting units 820 on the substrate 810 through eutectic bonding and electrically connect the substrate 810.

Then, a non-conductive layer 850 is disposed. By performing a polishing process, the second electrodes (not shown) of the semiconductor light emitting units 820 that are at the top are exposed. The non-conductive layer 850 is disposed between two adjacent light emitting units 820. For example, the non-conductive layer 850 is disposed between every two adjacent semiconductor light emitting units 820. In addition, a conductive layer 830 is disposed in a way that the conductive layer 830 is located above the non-conductive layer 850 and the semiconductor light emitting units 820. Therefore, the non-conductive layer 850 is disposed between the substrate 810 and the conductive layer 830. The non-conductive layer 850 electrically isolates the substrate 810 and the conductive layer 830. In addition, the fabricating method of the semiconductor light emitting device in this embodiment further includes electrically connecting the semiconductor light emitting units 820 together to the conductive layer 830 through the second electrodes (not shown) of the semiconductor light emitting units 820.

Besides, some embodiments of the fabricating method of the semiconductor light emitting device further include making a thickness of the insulating protective layer greater than those of the connecting conductors, and the insulating protective layer and the connecting conductors form a plurality of holes. Each hole corresponds to one alignment position, and the insulating protective layer between two adjacent semiconductor light emitting units forms a non-conductive wall. Descriptions concerning the corresponding components and electrical connection may be referred to the embodiment of FIG. 7 the semiconductor light emitting device 700, and thus are not repeated hereinafter.

FIG. 9A to FIG. 9H are schematic views showing a fabricating method of the semiconductor light emitting device according to yet another embodiment of the disclosure. The fabricating method of the semiconductor light emitting device of this embodiment is similar to the fabricating method of the semiconductor light emitting device in the embodiment of FIGS. 8A to 8H. In other words, a semiconductor light emitting device 900 is also similar to the semiconductor light emitting device 800. Description and components corresponding to the semiconductor light emitting device 900 and the fabricating method thereof may be referred to the embodiment of FIGS. 8A to 8H related to the semiconductor light emitting device 800 and the fabricating method thereof, and are thus not repeated hereinafter.

Figure 9A:
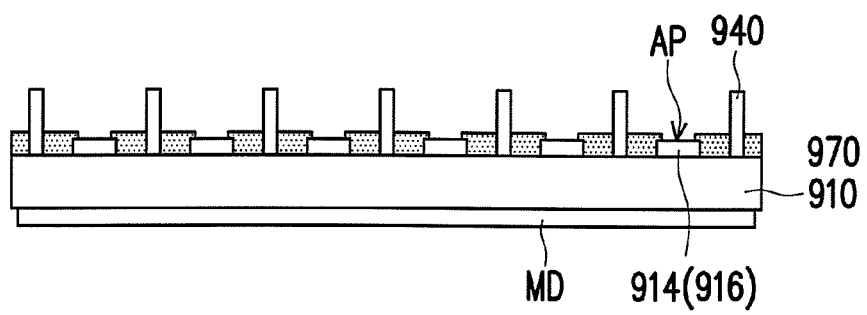
FIG. 9A to FIG. 9H are schematic views showing a fabricating method of the semiconductor light emitting device according to yet another embodiment of the disclosure.
Figure 9B:
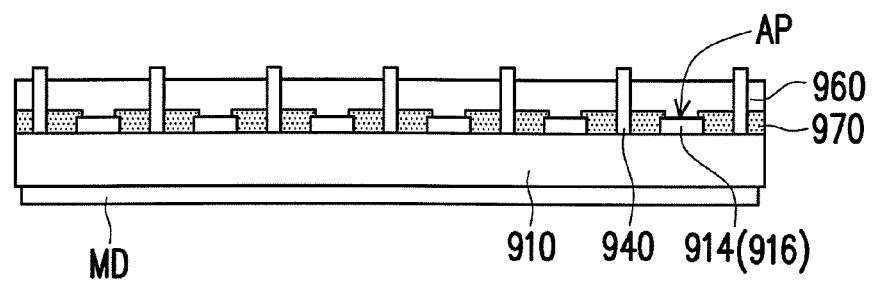
Figure 9C:
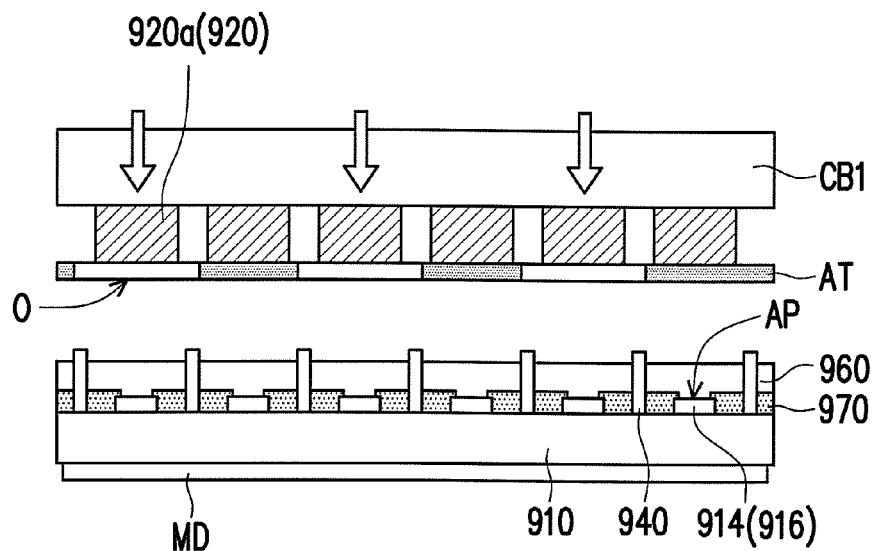

Compared with the embodiment of FIGS. 8A to 8H, the fabricating method of the semiconductor light emitting device of FIGS. 9A to 9H further includes a magnetic device MD disposed on one side of a substrate 910, as shown in FIGS. 9A and 9B. In this embodiment, the magnetic device MD may be a magnet, such as a permanent magnet, an electromagnet, or other devices or films having a magnetic force. In addition, the method of this embodiment includes disposing a plurality of non-conductive walls 940 on the substrate 910 on the other side opposite to the magnetic device MD. The alignment position AP is formed between every two adjacent non-conductive walls 940. Then, referring to FIG. 9C, a plurality of semiconductor light emitting units 920a (920) on the first carrier board CB1 are respectively aligned to the alignment positions AP by using the alignment tool AT. In addition, the semiconductor light emitting units 820a on the first carrier board CB1 are divided into a plurality of groups.

Figure 9D:
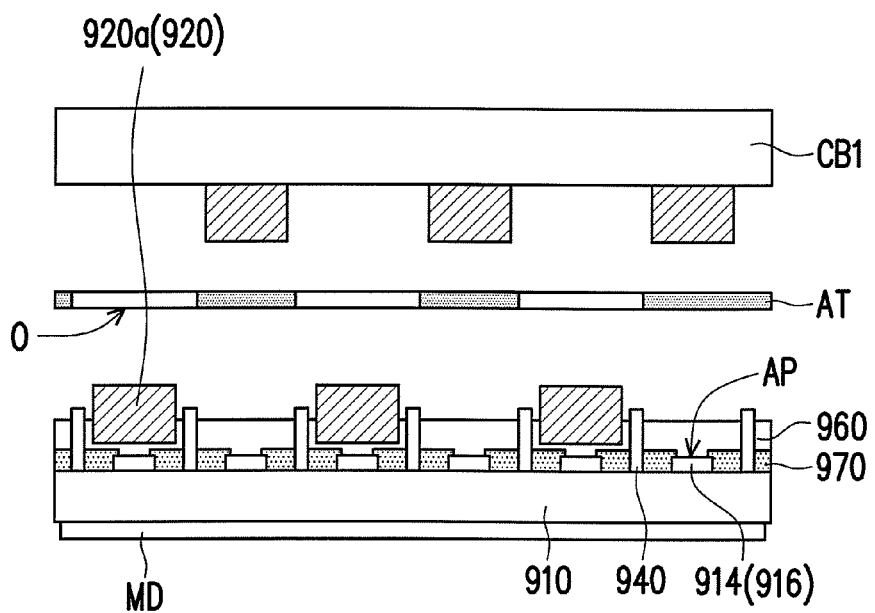

Then, referring to FIG. 9D, the semiconductor light emitting units 920a (920) in one of the groups on the first carrier board CB1 are dissociated from the first carrier board CB1. Then, the semiconductor light emitting units 920a (i.e., the semiconductor light emitting units 920a indicated with arrows in FIG. 9C) of the group on the first carrier board CB1 and the magnetic device MD magnetically attract each other. Thus, the semiconductor light emitting devices 920a fall into the corresponding alignment positions AP through guidance of the alignment tool AT and functioning of a magnetic force. To make the semiconductor light emitting units 920a magnetically sensitive, a magnetic film (not shown) may be additionally disposed on the semiconductor light emitting units 920a. Through functioning of a magnetic field, the semiconductor light emitting units 920a become magnetically sensitive. Thus, the semiconductor light emitting units 920a and the magnetic device MD may attract each other, thereby increasing a momentum when the semiconductor light emitting units 920a are aligned to and fall into the alignment positions AP.

Figure 9E:
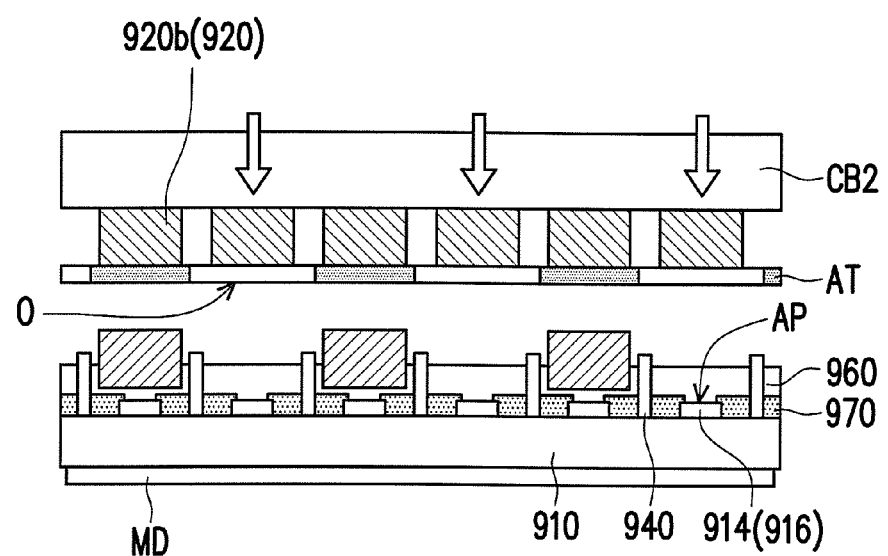

Then, referring to FIG. 9E, a plurality of semiconductor light emitting units 920b (920) on the second carrier board CB2 are respectively aligned to the alignment positions AP by using the alignment tool AT. The semiconductor light emitting diodes 920b on the second carrier board CB2 are divided into a plurality of groups. In this embodiment, the semiconductor light emitting units 920b on the second carrier board CB2 and the semiconductor light emitting units 920a on the first carrier board CB1 have different emission colors. Besides, the alignment positions AP that the semiconductor light emitting units 920b on the second carrier board CB2 correspond to are different from the alignment positions AP that the semiconductor light emitting units 920a on the first carrier board CB1 correspond to.

Figure 9F:
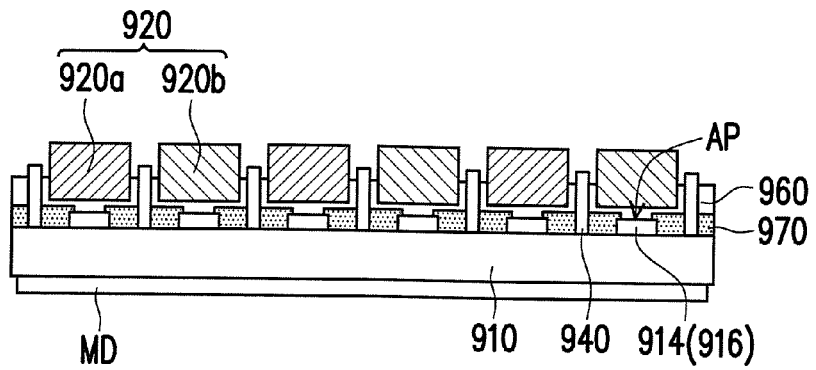

Referring to FIGS. 9E and 9F together, the semiconductor light emitting units 920b (920) in one of the groups on the second carrier board CB2 are dissociated from the second carrier board CB2. In this way, the semiconductor light emitting units 920b (i.e., the semiconductor light emitting units 920B indicated with arrows in FIG. 9E) of the group on the second carrier board CB2 and the magnetic device MD may magnetically attract each other, making the semiconductor light emitting units 920b fall into the corresponding alignment positions AP. The way that makes the semiconductor light emitting units 920b magnetically sensitive may also follow the way that makes the semiconductor light emitting units 920a magnetically sensitive. By adding a magnetic film (not shown) to the semiconductor light emitting units 920b and making the semiconductor light emitting units 920b magnetically sensitive through functioning of a magnetic field, the semiconductor light emitting units 920b and the magnetic device MD may attract each other, such that the semiconductor light emitting units 920b fall into the alignment positions AP.

Figure 9G:
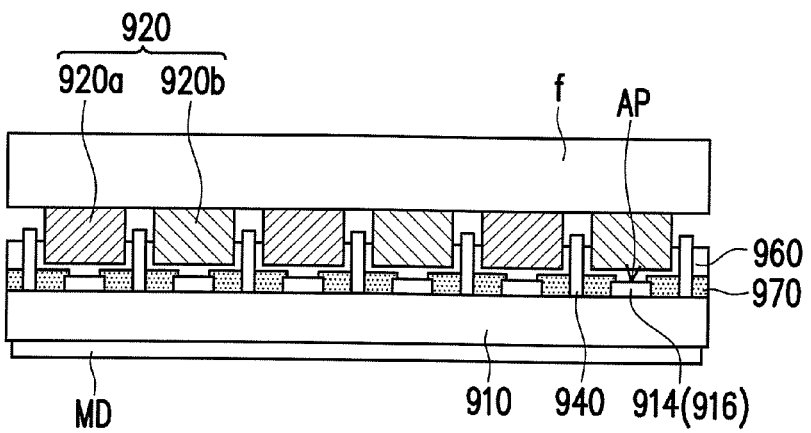
Figure 9H:
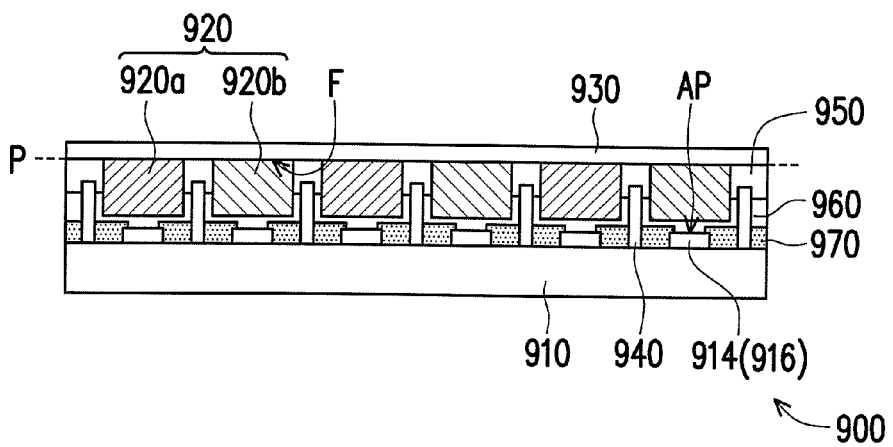

Next, referring to FIGS. 9G and 9H, each semiconductor light emitting unit 920 (920a and 920b) is electrically connected with the substrate 910 through the first electrode. In addition, a conductive layer 930 is disposed on the semiconductor light emitting units 920. In this way, the semiconductor light emitting units 920 are electrically connected together to the conductive layer 930 through the second electrodes (not shown) of the semiconductor light emitting units 920. Relevant description concerning other components and layers in the semiconductor light emitting device 900 in the embodiment of FIGS. 9A to 9H may be referred to the semiconductor light emitting device 800 in the embodiment of FIGS. 8A to 8H and other embodiments extended therefrom. In addition, the fabricating method of the layers and components in FIGS. 9A to 9H may be referred to the fabricating method in the embodiment of FIGS. 8A to 8H and other embodiments extended therefrom.

Based on above, in the semiconductor light emitting device according to the embodiments of the disclosure, the non-conductive walls are disposed between adjacent semiconductor light emitting units to isolate the semiconductor light emitting units. Therefore, the semiconductor light emitting device may be fabricated through quick packaging and accurate alignment. Besides, the fabricating method of the semiconductor light emitting device according to the embodiments of the disclosure includes disposing the non-conductive walls on the substrate and forming the alignment position between every two adjacent non-conductive walls. Then, by making use of gravity or having the semiconductor light emitting device and the magnetic device magnetically attract each other, the semiconductor light emitting units fall into the corresponding alignment positions. In this way, the fabricating method of the semiconductor light emitting device achieves quick packaging and accurate alignment.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A semiconductor light emitting device, comprising:
   a substrate;
   a plurality of semiconductor light emitting units, disposed on the substrate to form an array, wherein each of the semiconductor light emitting units has a first electrode and a second electrode opposite to each other, each of the semiconductor light emitting units is electrically connected with the substrate through the first electrode, and the second electrode is off centered;
   a conductive layer, disposed on the semiconductor light emitting units, wherein the semiconductor light emitting units are electrically connected together to the conductive layer through the second electrodes; and
   a plurality of non-conductive walls, disposed between the adjacent semiconductor light emitting units to separate the semiconductor light emitting units,
   wherein the substrate comprises a circuit structure and a plurality of connecting conductors, each of the connecting conductors is disposed on the circuit structure and correspondingly disposed between one of the semiconductor light emitting units and the circuit structure so as to separate the one of the semiconductor light emitting units and the circuit structure, and each of the first electrodes is electrically connected with the circuit structure through one of the connecting conductors.

2. The semiconductor light emitting device as claimed in claim 1, wherein the non-conductive walls are arranged on the substrate in a grid pattern, the non-conductive walls and the substrate form a plurality of accommodating spaces, and each of the semiconductor light emitting units is disposed in one of the accommodating spaces.

3. The semiconductor light emitting device as claimed in claim 1, further comprising a non-conductive layer, disposed between the substrate and the conductive layer and between two adjacent semiconductor light emitting units.

4. The semiconductor light emitting device as claimed in claim 1, wherein the semiconductor light emitting units comprise a red semiconductor light emitting unit, a green semiconductor light emitting unit, and a blue semiconductor light emitting unit.

5. The semiconductor light emitting device as claimed in claim 1, wherein the substrate further comprises a plurality of electrode pads, each of the electrode pads is correspondingly disposed between one of the connecting conductors and the circuit structure, and the connecting conductors electrically connect the first electrodes and the circuit structure through the electrode pads.

6. The semiconductor light emitting device as claimed in claim 1, wherein a material of the connecting conductors comprises a metal.

7. The semiconductor light emitting device as claimed in claim 1, further comprising a plurality of conductive bumps, wherein each of the conductive bumps is disposed between the first electrode of one of the semiconductor light emitting units and the corresponding connecting conductor.

8. The semiconductor light emitting device as claimed in claim 7, further comprising an insulating protective layer, disposed between the substrate and the conductive bumps, wherein each of the connecting conductors has a connecting area, each of the first electrodes is electrically connected with the substrate through the connecting area of one of the connecting conductors, and the insulating protective layer covers the substrate and areas other than the connecting areas.

9. The semiconductor light emitting device as claimed in claim 7, wherein the insulating protective layer and the connecting conductors form a plurality of holes, a thickness of the insulating protective layer is greater than those of the connecting conductors, each of the holes corresponds to a position of one of the semiconductor light emitting units, and the insulating protective layer between two adjacent semiconductor light emitting units forms the non-conductive walls.

10. The semiconductor light emitting device as claimed in claim 7, wherein a material of the bonding layer comprises a conductive material.

11. The semiconductor light emitting device as claimed in claim 1, wherein the first electrode of each of the semiconductor light emitting units is bonded to the substrate through eutectic bonding, and is electrically connected with the substrate.

12. The semiconductor light emitting device as claimed, in claim 1, wherein surfaces of the semiconductor light emitting units on a side facing away from the substrate are located on a same horizontal plane.

13. The semiconductor light emitting device as claimed in claim 7, wherein each of the conductive bumps is correspondingly disposed between one of the first electrodes and the connecting conductor, and each of the first electrodes is electrically connected with the connecting conductor through one of the conductive bumps.

14. The semiconductor light emitting device as claimed in claim 13, wherein a material of the bonding layer comprises a non-conductive material.

15. The semiconductor light emitting device as claimed in claim 1, wherein the semiconductor light emitting unit further comprises a semiconductor stack layer disposed between the first electrode and the second electrode, and the light semiconductor light emitting units are light emitting diodes.

* * * * *